United States Patent [19]

Ogoro

[11] Patent Number: 5,612,977
[45] Date of Patent: Mar. 18, 1997

[54] AUTOMATIC FREQUENCY CONTROL CIRCUIT FOR A RECEIVER OF PHASE SHIFT KEYING MODULATED SIGNALS

[75] Inventor: Kazuo Ogoro, Tokyo, Japan

[73] Assignee: NEC Corporation, Japan

[21] Appl. No.: 365,574

[22] Filed: Dec. 28, 1994

[30] Foreign Application Priority Data

Dec. 28, 1993 [JP] Japan .................................. 5-335120

[51] Int. Cl.[6] .................................................. H04L 27/06
[52] U.S. Cl. ........................ 375/344; 375/329; 329/306; 455/164.1; 455/182.2; 455/192.2
[58] Field of Search .................................. 375/279, 284, 375/324, 326, 329, 344; 329/304, 306, 307; 331/1 A; 455/164.1, 164.2, 182.2, 192.1, 192.2, 257

[56] References Cited

U.S. PATENT DOCUMENTS

| 5,325,401 | 6/1994 | Halik et al. ............................. 375/329 |
| 5,513,388 | 4/1996 | Suganuma ................................ 375/344 |
| 5,517,678 | 5/1996 | Klank et al. ......................... 455/182.2 |

FOREIGN PATENT DOCUMENTS

| 0259867 | 3/1988 | European Pat. Off. . |
| 5-227237 | 9/1993 | Japan . |

Primary Examiner—Stephen Chin
Assistant Examiner—Don Vo
Attorney, Agent, or Firm—Ostrolenk, Faber, Gerb & Soffen, LLP

[57] ABSTRACT

A frequency control circuit for a receiver of phase shift keying (PSK) modulated signals comprises intermediate frequency (IF) signal generation circuit for generating an IF signal from a local oscillation signal. A measurement circuit measures the frequency of the IF signal. A detection circuit detects the frequency shift due to the PSK modulation to output a frequency shift signal in response to a first control signal. A control circuit detects that the frequency of the IF signal is converged until the detection circuit can detect the frequency shift due to the PSK modulation. A frequency control circuit further comprises an arithmetic operation circuit for detecting the frequency of the IF signal which can not be affected by the frequency shift due to the PSK modulation, a local oscillation signal generation circuit for outputting a local oscillation frequency signal in accordance with a second control signal, and a compensation circuit for compensating the second control signal in order to converge the frequency of the IF signal on a desired frequency.

15 Claims, 9 Drawing Sheets

AUTOMATIC FREQUENCY CONTROL CIRCUIT FOR A RECEIVER OF PHASE SHIFT KEYING MODULATED SIGNALS

BACKGROUND OF THE INVENTION

1. Field of the Invention

The present invention relates to an automatic frequency control circuit (hereinunder referred to as AFC) for converging input signals on any desired frequency of intermediate frequencies, and more particularly to an AFC for a receiver of phase shift keying (hereinunder referred to as PSK) modulated signals.

2. Description of the Related Art

Recently, a PSK modulation has been widely used as a modulation of radio signals.

In particular, a π/4 shift QPSK (hereinunder referred to as QPSK) modulation for shifting round a symbol phase every 45° has attracted attention. The QPSK modulation modulates the frequency of the carrier wave with transmit signals, and the frequency of the received signals also varies every moment. Thus, it is not possible to adopt an AFC which generates any desired intermediate frequency signal (hereinafter referred to as IF signal) from the received signals and the local oscillation signals.

In order to overcome the above-described problem, there is proposed the AFC disclosed in Japanese Patent application laid-open Heisei 5-22723 (hereinafter referred to as Reference 1) of Sept. 3rd, 1993, for example.

The AFC described in Reference 1 detects the frequency of the IF signal as well as the frequency shift of the IF signal due to the QPSK modulation, and to produce a compensation value. Further, the frequency of the IF signal is compensated by using the compensation value, and the frequency deviation caused by the QPSK modulation is eliminated.

Although the AFC explained in Reference 1 can obtain a desired IF signal only when the frequency of the IF signal are shifted due to the π/4 QPSK modulation, it is not possible to cope with the frequency deviation of the reference oscillation circuit for the intermediate frequency signal.

SUMMARY OF THE INVENTION

It is an object of the present invention to provide a frequency control circuit for a receiver of phase shift keying modulated signals which generates an intermediate frequency having a desired frequency even when the frequency of received signals is varied every moment due to the QPSK modulation and the frequency deviation of the local oscillation signals is large.

It is another object of the present invention to provide a frequency control circuit for a receiver of phase shift keying modulated signals which subtracts the deviation of the frequency caused by the QPSK modulation from the frequency of the IF signals in order to detect a substantial frequency of the IF signals, when the frequency of the IF signals is converged on a desired frequency to such an extent that the QPSK demodulation is possible.

It is still another object of the present invention to provide a frequency control circuit for a receiver of phase shift keying modulated signals which detects the frequency shift due to the QPSK modulation by QPSK-demodulating the IF signals.

It is a further object of the present invention to provide a frequency control circuit for a receiver of phase shift keying modulated signals which generates any desired IF signals by gradually compensating the frequency of local oscillation signals to produce IF signals.

A frequency control circuit of the present invention comprises an IF signal generation circuit for generating IF signals from radio signals and the local oscillation signals. A measurement circuit measures the frequency of the IF signals to output first frequency measurement signals. A detection circuit detects the frequency shift caused by the PSK modulation to output frequency shift signals. A control circuit detects that the frequency of the IF signals is converged until the detection circuit can detect the frequency shift caused by the PSK modulation.

Further, the frequency control circuit of the present invention may comprises an arithmetic operation circuit for detecting from frequency measurement signals and the frequency shift signals a frequency of the IF signals which is not affected by the frequency shift caused by the PSK modulation to output second frequency measurement signals; a local oscillation signal generation circuit for outputting local oscillation frequency signals on the basis of second control signals; and a compensation circuit for receiving the first frequency measurement signals and the second frequency measurement signals and compensating the second control signals in order to converging the frequency of the intermediate frequency signals on a desired frequency.

With such an arrangement, the present frequency control circuit detects that the frequency of the IF signals is converged until the detection circuit detects the frequency shift due to the PSK modulation, and at this time, the control circuit outputs the first control signal. Upon receiving the first control signal, the detection circuit detects the frequency shift caused by the PSK modulation and outputs the frequency shift signal. The arithmetic operation circuit subtracts the frequency shift signal from the frequency measurement signal and further outputs the frequency of the IF signals which is not affected by the frequency shift due to the PSK modulation. Since the second control signal for the local oscillation signal is compensated by detection of the frequency deviation of the IF signal which can not be affected by the frequency shift due to the PSK modulation from a desired frequency of the IF signal in the compensation circuit, the frequency of the IF signal generated from the local oscillation signal is converged on a desired frequency.

BRIEF DESCRIPTION OF THE DRAWINGS

These and other object, features and advantages of the invention will become more fully apparent from the following detailed description taken in conjunction with the accompanying drawings.

DETAILED DESCRIPTION OF THE PREFERRED EMBODIMENT

A brief explanation will now be given as to the QPSK modulation with reference to FIG. 1 for the better understanding of the present invention.

Figure 1:
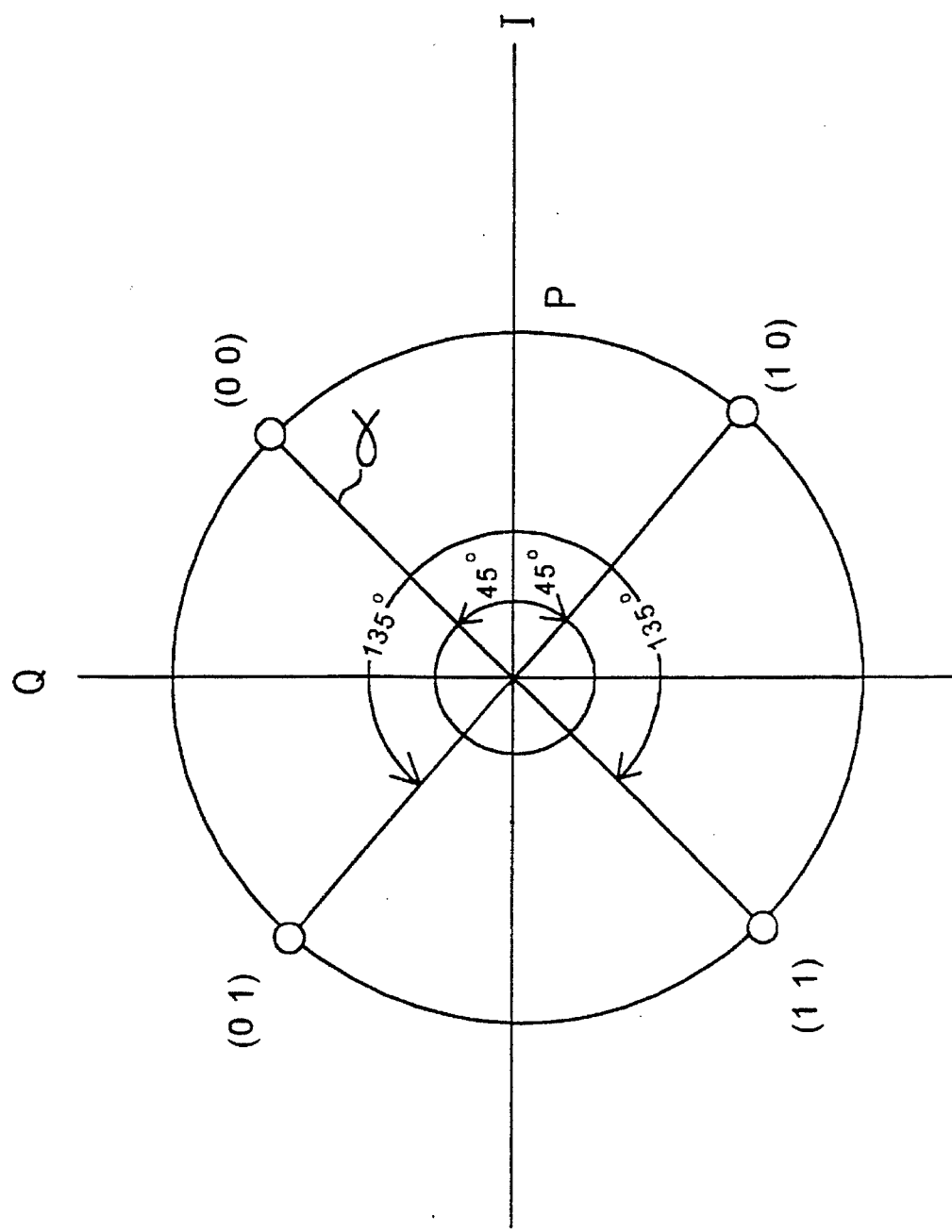
FIG. 1 is an IQ plane view used for explaining the QPSK modulation.

Referring to FIG. 1, it is assumed that a transmit signal includes two-bit codes. i.e., 00, 01, 11 and 10, and a symbol rate is determined as 21 k symbol/S. When the carrier wave signal is modulated with the transmit signals, the vector $\alpha$ makes 45°, 135°, −135° and −45° rotations on the IQ plane with a reference point P as the reference of rotation. That is, the QPSK-modulated carrier is phase-shifted by an angle equal to that formed by the vector $\alpha$ which rotates on the IQ plane and the axis I.

Further, since one rotation of the vector $\alpha$ on the IQ plane means 1 hz shift of the frequency, the aforementioned angle shift of the carrier is equivalent to the frequency shift.

For example, since the angle shift is 45° when the transmit signal is 00, one rotation of the vector $\alpha$ on the IQ plane means 8-symbol rate (45°/360°), and at this time the frequency shift of the carrier is hence:

$$21[k\ symbol/S]] \times 1[hz]/8[symbol]=2.625[kHz]$$

The relationship among the transmit signals, the angle shift of the carrier and the frequency shift is shown in Table.

TABLE

| Transmit signal | Angle shift | Frequency shift |
|---|---|---|
| 00 | 45° | 2.625 kHz |
| 01 | 135° | 7.875 kHz |
| 11 | −135° | −7.825 kHz |
| 10 | −45° | −2.625 kHz |

The QPSK demodulation will now be described in connection with FIG. 2.

Figure 2:
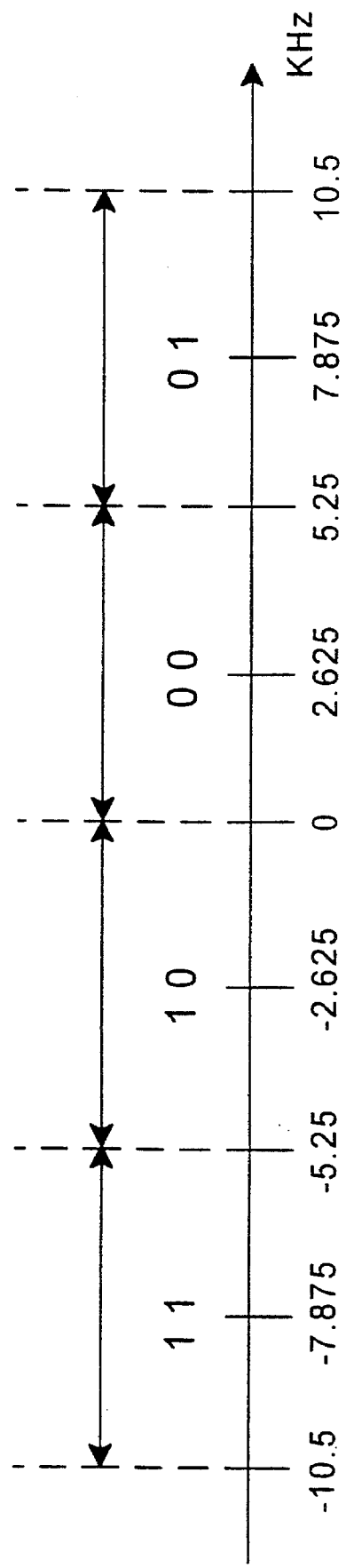
FIG. 2 is a diagrammatic view of frequency shift values, which is used for explaining the method of demodulating IF signals.

Referring to FIG. 2, it is assumed that the frequency deviation of a desired IF signal is 0 kHz when no frequency shift is made by the QPSK modulation.

When the frequency deviation of the IF signal is 0 to 5.25 kHz, a receiver recognizes that the transmit signal is 00.

Further, the demodulation of the next transmit signal to be received is performed on the basis of the frequency shift of the IF signal which is currently received. In other words, since the transmit signal which is currently received is recognized as 00, the frequency shift 2.625 kHz is determined as a reference value. When the shift of the IF which is subsequently received is within ±2.625 kHz with respect to the above reference value, the transmit signal is recognized as 00; when the same is equal to or above 2.625 kHz and equal to or below 7.875 kHz, the transmit signal is recognized as 01; when the same is equal to or above −7.875 kHz and equal to or below −2.625 kHz, the transmit signal is recognized as 10; and when the same is equal to or above −13.125 kHz and equal to or below −7.875 kHz, the transmit signal is recognized as 11.

When any deviation other than that caused by the QPSK modulations included in the frequency of the IF signal, however, there occurs a problem in the above-described demodulation.

Concretely, when the frequency of the IF signal deviates by ±⅛ or more with respect to one symbol, i.e., when this frequency deviates from the reference IF by ±2.625 kHz or more due to a factor other than the QPSK modulation, the accurate demodulation is not possible.

Referring again to FIG. 2, the brief explanation will be given hereinbelow. It is assumed that the transmit signals has been transmitted in the order of 10, 11 and 00. When the frequency shift obtained by QPSK modulation with the firstly-received signal 10 is −2.625 kHz and the frequency is shifted within the range from −5.25 kHz to 0 kHz with respect to the desired IF signal 450 kHz, the transmit signal is detected as 10. However, when the frequency of the IF signal deviates by −2.625 kHz or more due to the deviation of the oscillation frequency output from a reference oscillation circuit, the frequency shift of the IF signal to be detected becomes −2.625 kHz+(−2.625 kHz) or more, i.e., −5.25 kHz or more and the detection of the transmit signal would be mistaken, i.e., the transmit signal is detected as 11.

Further, since the demodulation of the next signal to be received is carried out by using the frequency shift −7.875 kHz as a reference, the accurate modulation is impossible.

Referring again to the AFC described in the aforementioned Reference 1, a desired IF is obtained by eliminating the frequency shift due to the QPSK modulation from the frequency of the IF signal, the deviation is thus produced to the oscillation frequency output from the reference oscillation circuit constituting the AFC. When the transmit signal is 10 and the deviation exceeds −2.625 kHz, the accurate demodulation becomes impossible, as described above. Therefore, a desired IF signal can not be obtained in the AFC according to Reference cited 1.

The present invention which can solve the above-described problems will now be explained.

Figure 3:
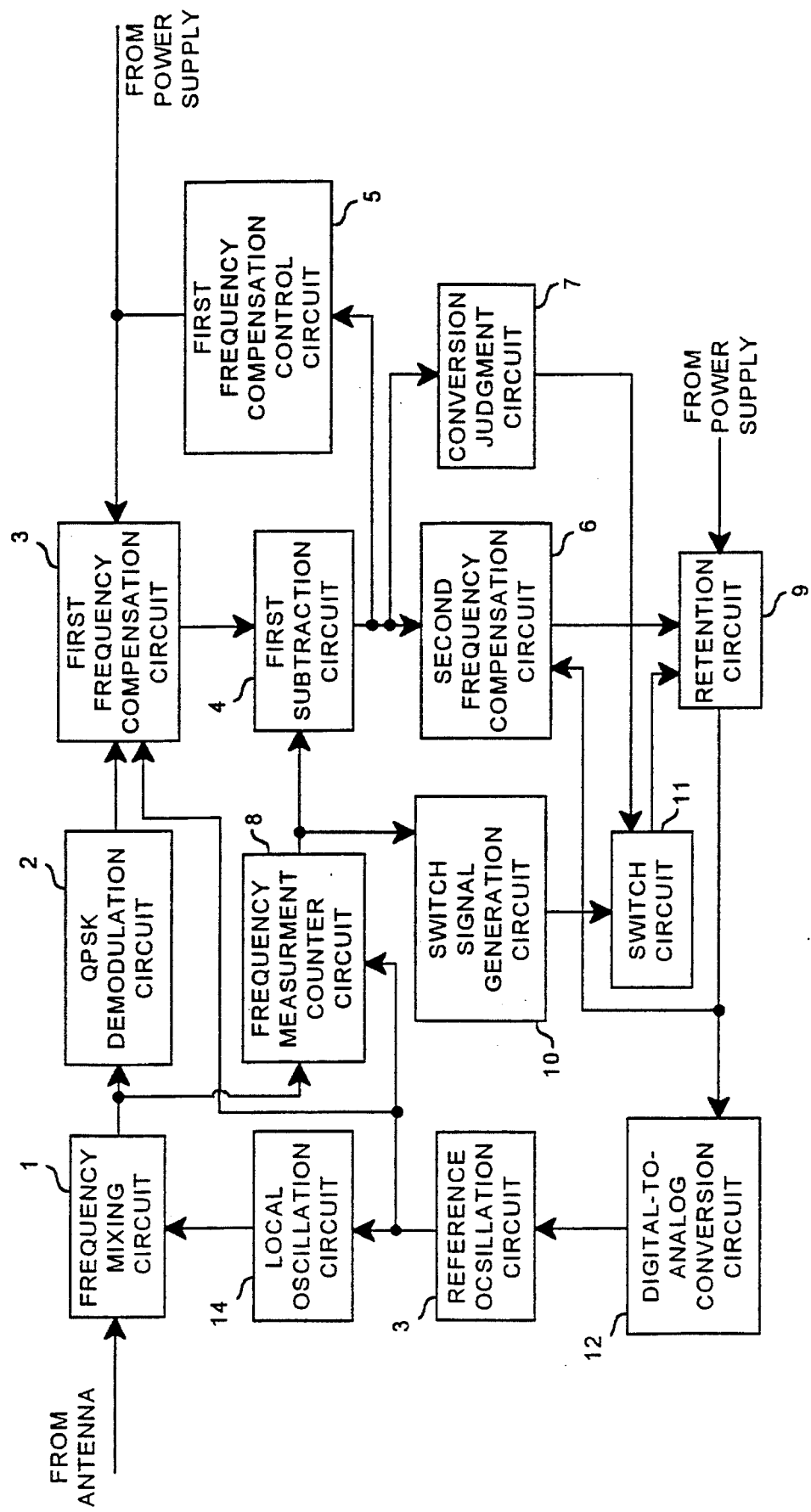
FIG. 3 illustrates an automatic frequency control circuit for a receiver of QPSK modulated signals according to a first embodiment of the present invention.

In FIG. 3, a frequency mixing circuit 1 mixes a frequency output from a non-illustrated antenna with a local oscillation frequency signal output from a local oscillator (referred to as a PLL circuit hereunder) 14 and outputs an IF signal.

A reference oscillation circuit 13 outputs a reference frequency signal to the PLL circuit 14 in accordance with a control voltage signal output from a later-described digital-to-analog conversion circuit (referred to as a DAC hereinafter) 12.

A frequency measurement counter circuit 8 counts the frequency of the IF signal on the basis of the reference frequency signal and outputs a frequency count signal.

A QPSK demodulation circuit 2 demodulates the IF signal and outputs a demodulated signal.

A first frequency compensation circuit 3 receives the demodulated signal and detects the frequency shift of the IF signal due to the QPSK modulation. Thus, the first frequency compensation circuit 3 integrates the detected frequency shift in accordance with the reference frequency signal to obtain its mean value and outputs a frequency shift count signal. In addition, the first frequency compensation circuit 3 does not output frequency shift count signal to a first subtraction circuit 4 when the power supply is turned on.

The first subtraction circuit 4 subtracts the frequency shift count signal from the frequency count signal. In other words, the first subtraction circuit 4 subtracts the amount of the frequency shift of the IF signal caused by the QPSK modulation from the frequency of the IF signal and outputs a compensation signal.

A first frequency compensation control circuit 5 detects that the IF signal is converged until QPSK demodulation circuit 2 can demodulate the IF signal and outputs a first control signal. That is, since the frequency of the IF signal deviates due to the frequency shift of the reference frequency signal caused by a temperature change besides the frequency shift caused by the QPSK modulation, the first frequency compensation control circuit 5 is used to overcome such a drawback that the QPSK demodulation circuit 2 can not perform the demodulation when the deviation of the frequency of the reference frequency signal is large. Since the range of the frequency deviation of the IF signal with which the QPSK demodulation circuit 2 can carry out the demodulation is within 2.625 kHz, the first frequency compensation control signal outputs the first control signal when the frequency of the IF signal is converged within this range and controls to input the frequency shift count signal output to the first subtraction circuit 4.

A convergence judgement circuit 7 judges whether the frequency of the IF signal is converged within the allowance with respect to a value on which the frequency is to be finally converged, and outputs a convergence completion signal. In other words, since the allowance of the frequency deviation of the IF signal from the desired frequency of the IF signal is within 3 ppm, the convergence judgement circuit 7 outputs the convergence completion signal when the frequency deviation of the IF signal is converged within this range.

A second frequency compensation circuit 6 adds or subtracts a fixed value to or from the compensation signal in order to compensate the frequency deviation of the IF signal due to the temperature change or the like, and outputs a second control signal.

A switch signal generation circuit 10 receives the frequency count signal and outputs a switch signal synchronized with such a timing that the second frequency compensation circuit 6 outputs the second control signal.

A switch circuit 11 interrupts the input of the switch signal to a retention circuit 9 upon receiving the convergence completion signal.

The retention circuit 9 is constituted by a D flip-flop and receives the switch signal at a clock terminal CK thereof. Further, a power supply control signal from the power supply is input to a PR terminal, and the value of retention circuit 9 is set to an initial value. Moreover, the retention circuit 9 receives the second control signal at a D terminal thereof and outputs a value retained therein as a retention signal from an output terminal Q thereof.

A DAC 12 subjects the retention signal to the digital-to-analog conversion and outputs a control voltage signal.

Figure 4:
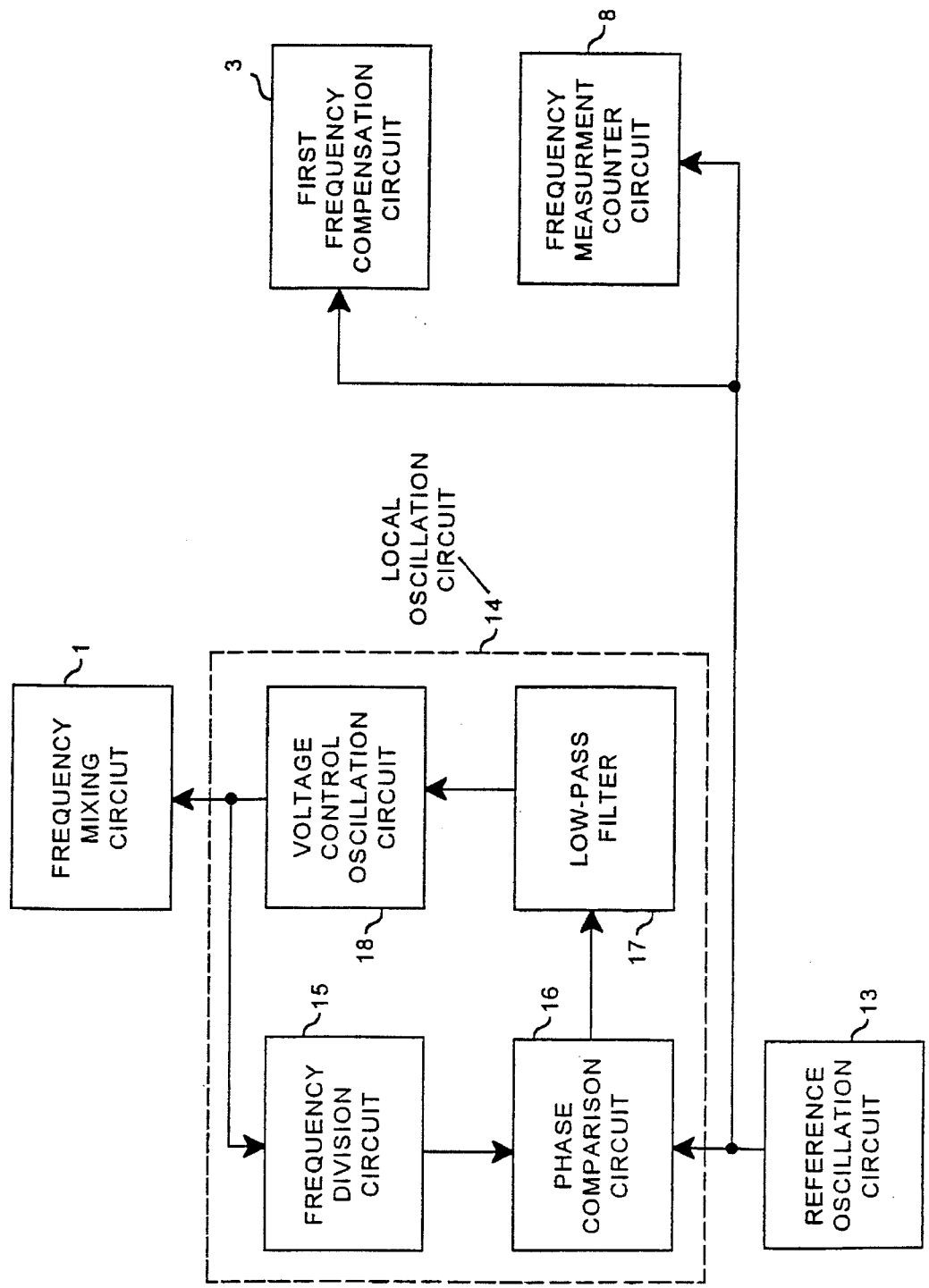
FIG. 4 is a block diagram for explaining the detail of a local oscillation circuit shown in FIG. 3.

As shown in FIG. 4, the PLL circuit 14 comprises a frequency division circuit 15, a phase comparison circuit 16, a low-pass filter 17 and a voltage control oscillation circuit 18. The frequency division circuit 15 divides the frequency of the local oscillation frequency signal output from the voltage control oscillation circuit 18 and outputs a frequency division signal. The phase comparison circuit 16 receives the frequency division signal and the reference frequency signal and outputs a phase difference signal indicating the phase difference between the received two signals. The low-pass filter 17 interrupts high-frequency components of the phase difference signal, namely, the filter 17 integrates the phase difference signals for a predetermined time and outputs an integration signal. The voltage control oscillation circuit 18 outputs a local oscillation frequency signal controlled by the integration signal.

Figure 5:
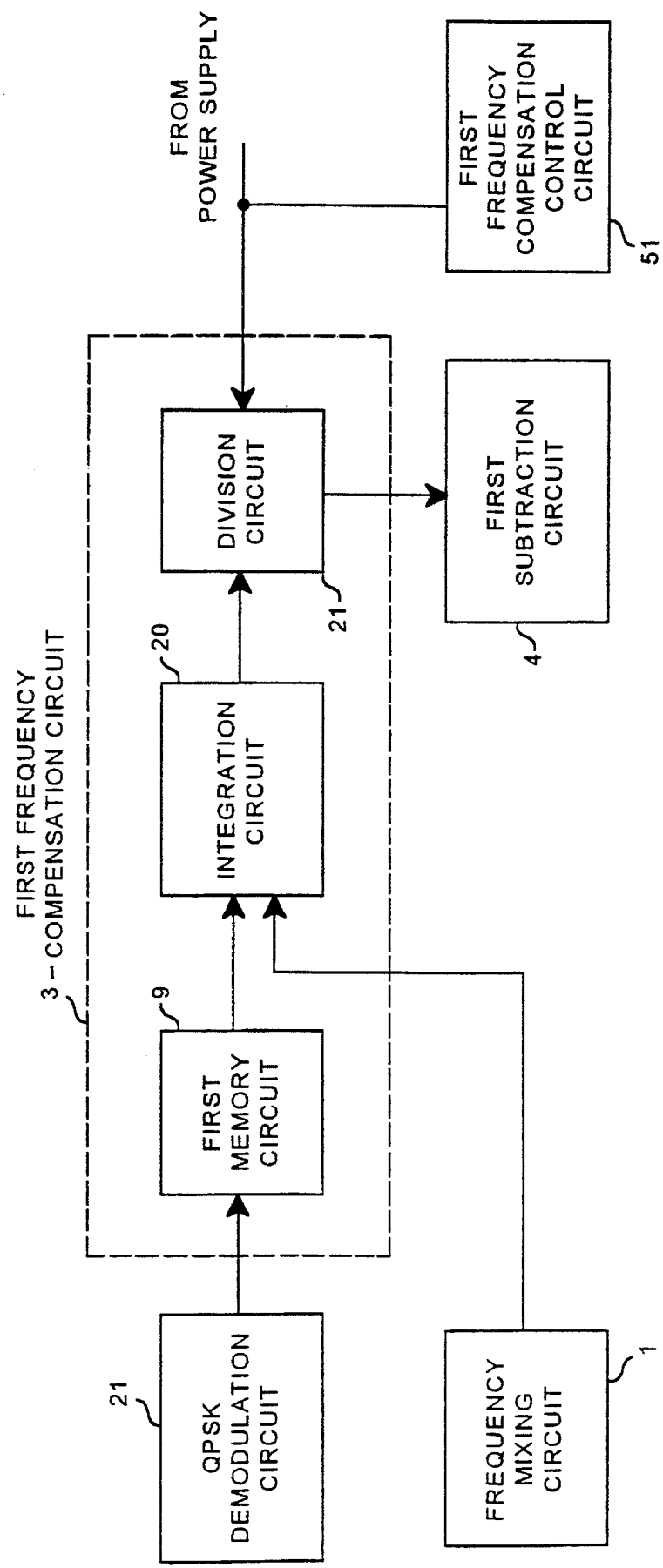
FIG. 5 is a block diagram for explaining the detail of a first frequency compensation circuit shown in FIG. 3.

Referring to FIG. 5, the first frequency compensation circuit 3 comprises a first memory circuit 19, an integration circuit 20 and a division circuit 21, The first memory circuit 19 uses the demodulation signal as an address and outputs a frequency shift digital signal indicating the frequency shift of the IF signal whose frequency has shifted due to the QPSK modulation. The integration circuit 20 uses the reference frequency signal as a clock and integrates the frequency shift digital signals in synchronism with the frequency count of the frequency measurement counter circuit 8 to output a frequency shift integration signal. The division circuit 21 divides the frequency shift integration signal by the number of frequency shift digital signals output from the first memory circuit 19. That is, the division circuit 21 calculates a mean value of the output frequency shift digital signals and outputs the frequency shift count signal. Further, the division circuit 21 receives the first control signal and outputs the frequency shift count signal to the first subtraction circuit 4 only when the QPSK demodulation circuit 2 can accurately demodulate the IF signal. In addition, the division circuit 21 is so controlled as not to output the frequency shift count signal when the power supply is turned on.

Figure 6:
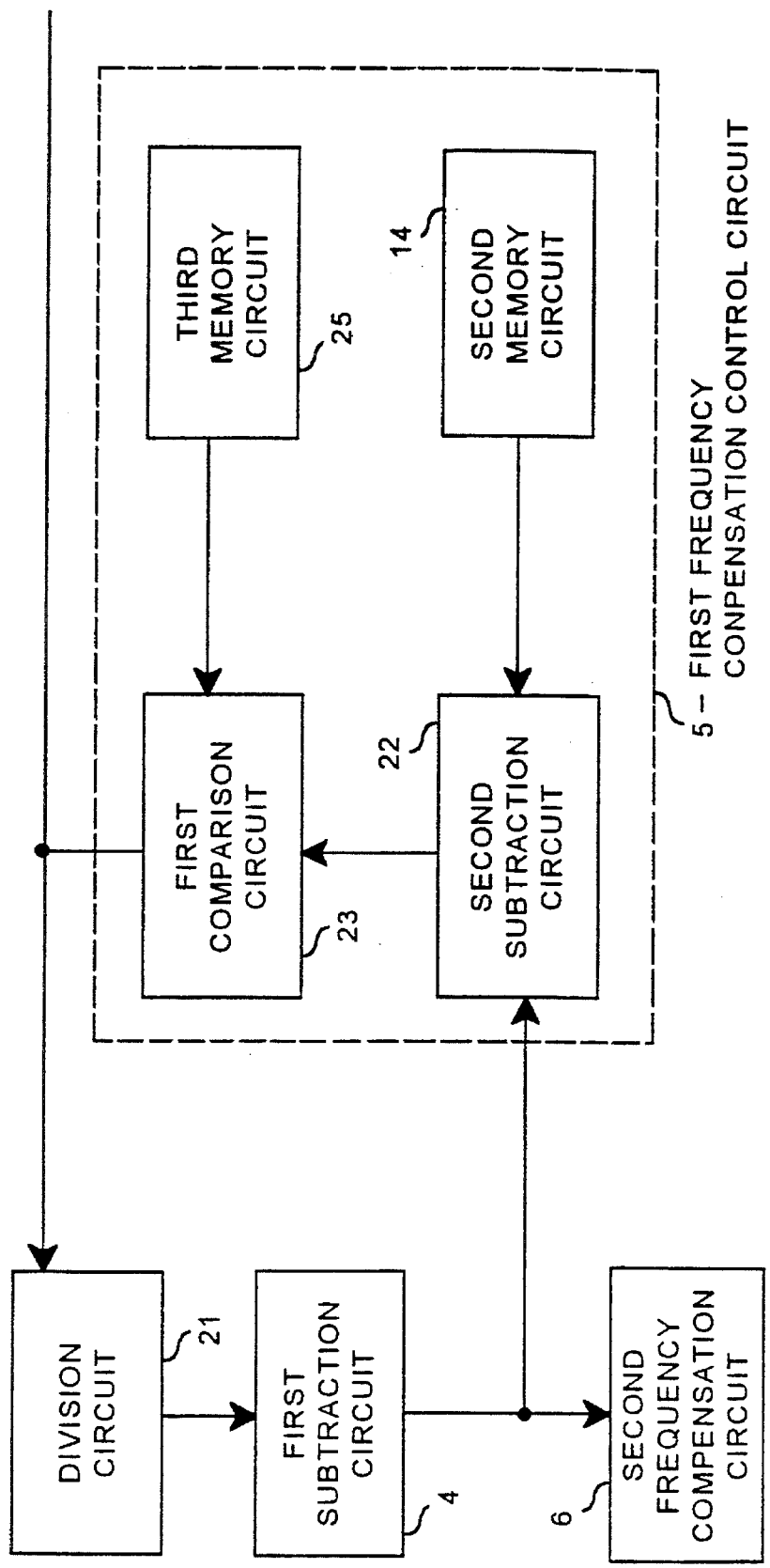
FIG. 6 is a block diagram for explaining the detail of a first frequency compensation control circuit shown in FIG. 3.

In FIG. 6, the first frequency compensation control circuit 5 is constituted by a second subtraction circuit 22, a first comparison circuit 23, a second memory circuit 24 and a third memory circuit 25. The second memory circuit 24 stores a truth value signal having a value on which the frequency of the IF signal is to be converged, and outputs this value to the second subtraction circuit 22.

The second subtraction circuit 22 subtracts the truth value from the compensation signal and outputs a first frequency shift signal. The third memory circuit 25 stores the frequency deviation within such a range that the QPSK demodulation circuit 2 can demodulate the IF signal, i.e., 2.625 kHz as a first frequency shift allowance signal, and outputs this signal to the first comparison circuit 23. The first comparison circuit 23 compares the first frequency shift signal with the first frequency allowance signal and outputs the first control signal which is equal to a high level signal when the first frequency shift signal belongs to the first frequency shift allowance signal, and subsequently controls the division circuit 21 to output the compensation signal to the first subtraction circuit 4. The first comparison circuit 23 outputs a low level signal when no first control signal is output and controls the division circuit 21 not to output the compensation signal.

Figure 7:
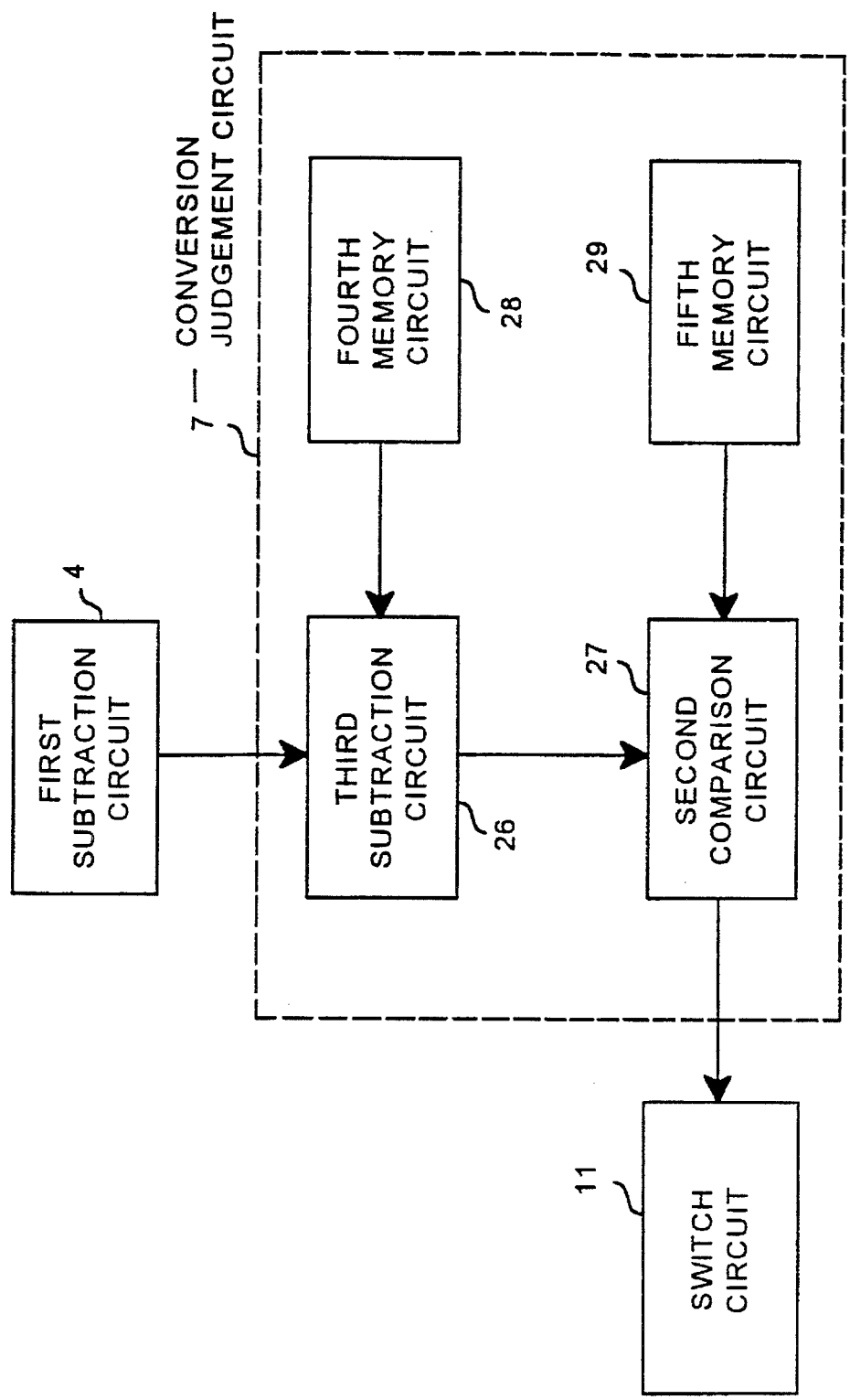
FIG. 7 is a block diagram for explaining the detail of a convergence judgement circuit shown in FIG. 3.

In FIG. 7, the convergence judgement circuit 7 includes a third subtraction circuit 26, a second comparison circuit 27, a fourth memory circuit 28 and a fifth memory circuit 29.

The fourth memory circuit 28 stores a truth value signal having a value on which the frequency of the IF signal is to be converged and outputs the truth value signal to the third subtraction circuit 22. The third subtraction circuit 26 subtracts the trueth value signal from a compensation signal and outputs a second frequency shift signal (the value of the second frequency shift signal is equivalent to the aforementioned value of the first frequency shift signal). The fifth memory circuit 29 stores the deviation of 3 ppm from the frequency of the predetermined IF signal as a second frequency allowance signal and outputs this stored signal to the third subtraction circuit 27. The second comparison circuit 27 compares the second frequency shift signal with the second frequency allowance signal, and outputs the convergence completion signal which is a low level signal when the second frequency shift signal belongs to the second frequency shift allowance signal and interrupts the input of the switch signal, through the switch circuit 11, to the retention circuit 9.

Figure 8:
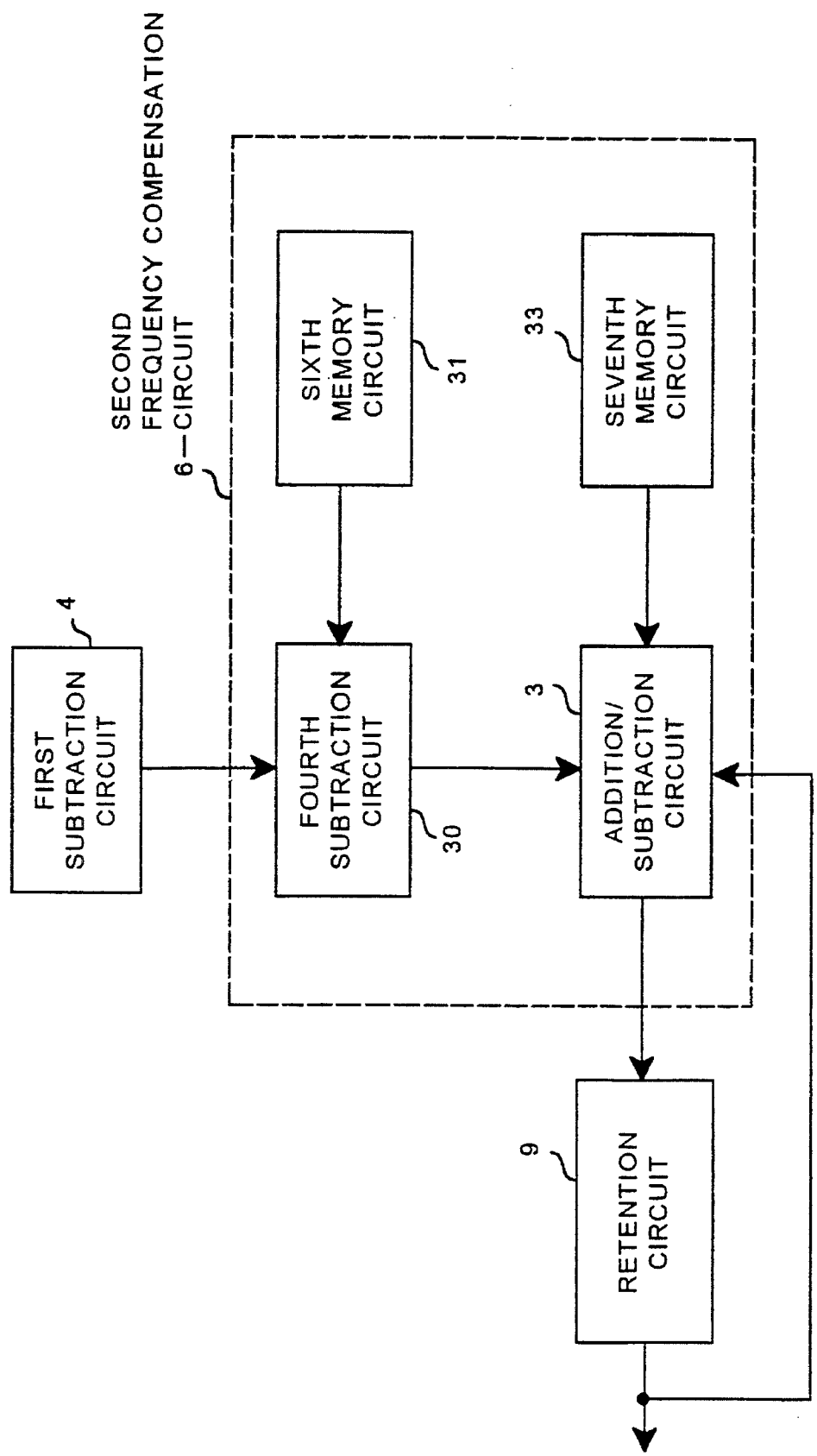
FIG. 8 is a block diagram for explaining the detail of a second frequency compensation circuit shown in FIG. 3.

Referring now to FIG. 8, the second frequency compensation circuit 6 is composed of a fourth subtraction circuit 30, a sixth memory circuit 31, an addition/subtraction circuit 32 and a seventh memory circuit 33.

The sixth memory circuit 31 stores a truth value signal having a value on which the frequency of the IF is to be converged and outputs the truth value signal to the fourth subtraction circuit 22. The fourth subtraction circuit 26 subtracts the truth value signal from the compensation signal and outputs a third frequency shift signal (the value of the third frequency shift signal is equivalent to the value of each of the above first and second frequency shift signals). The seventh memory circuit 33 stores a step width signal having a fixed step width and outputs the step width signal to the addition/subtraction circuit 33. The addition/subtraction circuit 32 performs the addition or subtraction with respect to the step width signal in accordance with the third frequency shift signal which is a control signal. Namely, the addition/subtraction circuit 32 subtracts the step width signal from the retention signal which is the output of the retention circuit 9 when the third frequency shift signal has a positive value while the circuit 32 adds the step width signal to the retention signal which is the output of the retention circuit 9 when the third frequency shift signal has a negative value, and outputs the second control signal.

Figure 9:
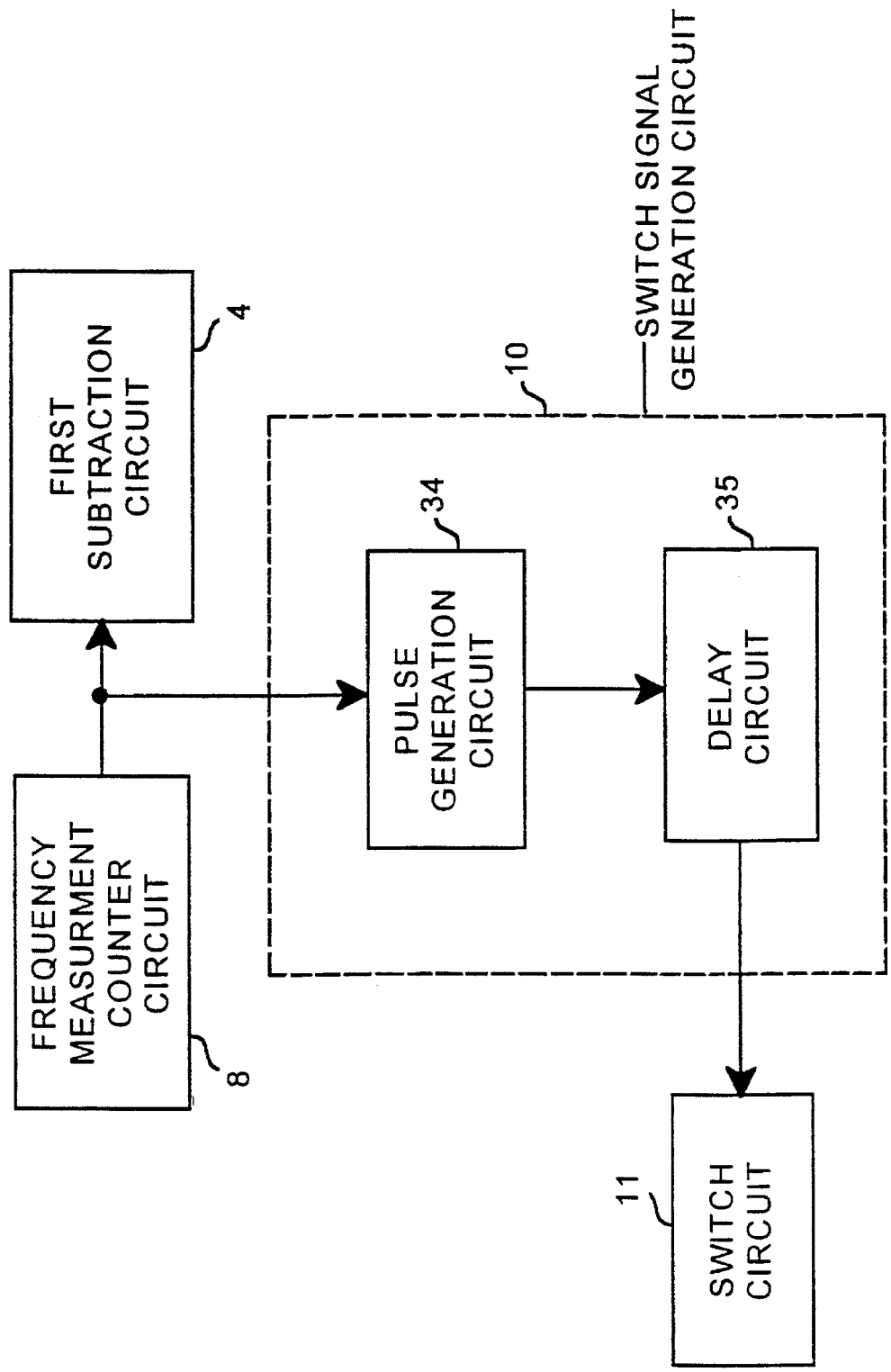
FIG. 9 is a block diagram for explaining the detail of a switch signal generation circuit shown in FIG. 3.

In FIG. 9, the switch signal generation circuit 10 is composed of a pulse generation circuit 34 and a delay circuit 35.

The pulse generation circuit 34 receives the frequency measurement count value signal and generates a pulse signal every time when the frequency measurement count value signal is reset to 0. The delay circuit 35 delays the pulse signal and outputs a switch signal. The amount of delay of the delay circuit 35 is determined in such a way that the switch signal is supplied to the retention circuit 9 through the switch circuit 1 in synchronism with the timing when the second control signal is input to the retention circuit 9.

The detailed description will now be given as to the operation of the frequency control circuit shown in FIG. 3.

When the power supply is turned on, the voltage control signal is input from the power supply circuit to the PR terminal of the retention circuit 9 and the retention circuit 9 is set to the initial value. This initial value is set to a count value at which the frequency in the middle of the range of the oscillation frequencies, which can be oscillated, of the reference frequency signal output from the reference oscillation circuit 13 is output. That is, assuming that the retention signal output from the retention circuit 9 is the 8-bit digital signal, the frequency of the reference frequency signal output from the reference oscillation circuit 13 has a maximum value when the count is 255 which is the maximum value of the 8-bit digital signal, meanwhile the same has a minimum value when the count is 0. Accordingly, the count 128 is the initial value of the retention circuit 9. Further, when the power supply is turned on, the output of the frequency shift count signal supplied from the division circuit 21 constituting the first frequency circuit 3 to the first subtraction circuit 4 is interrupted.

The retention signal which is a digital signal is converted to an analog signal by the DAC 12 and fed to the reference oscillation circuit 13 as the control voltage signal. The reference oscillation circuit 13 outputs the reference frequency signal having a frequency according to the received control voltage signal. The voltage control oscillation circuit 18 constituting the PLL circuit 14 outputs a value which has been locked before the power supply is turned on as an initial value, and the local oscillation frequency signal which is equal to this initial value is frequency-divided by the frequency division circuit 15 and the obtained frequency division signal is output to the phase comparison circuit 16. The phase comparison circuit 16 also receives the reference frequency signal and outputs a phase difference signal corresponding to the amount of the phase difference between the reference frequency signal and the frequency division signal to the low-pass filter 17. The low-pass filter 17 carries out the suppression of the high frequency components of the phase difference signal, i.e., the integration of the phase difference signal to output an integration signal. The voltage control oscillation circuit 18 fetches the integration signal as the control signal and outputs the local oscillation frequency signal synchronized with the phase of the reference frequency signal. The frequency of the reference frequency signal is directly proportional to the frequency of the local oscillation frequency signal. Thus, the frequencies of the local oscillation frequency signal and the IF signal can be set to desired frequencies, respectively, by setting the frequency of the reference frequency signal to a desired frequency.

The local oscillation frequency signal is input to the frequency mixing circuit 1, and the frequency mixing circuit 1 performs the frequency mixing of the local oscillation frequency signal and the signal received from the non-illustrated antenna to output the IF signal. In this embodiment, the frequency mixing is carried out in the upper local manner, and the intermediate frequency signal is generated by subtracting the frequency of the received signal from the local oscillation frequency signal.

In the frequency measurement counter circuit 8, the IF signal is subjected to the frequency count with the reference frequency signal as the clock signal, and the frequency count signal is output to the first subtraction circuit 4. In this embodiment, the time period during which the frequency measurement counter circuit 8 counts the frequency of the IF signal is one second.

The IF signal is also input to the QPSK demodulation circuit 2 to be demodulated therein. In this demodulation, assuming that the symbol rate of the transmit signals is 21 k symbol, the IF signals during one second are equal to 21 k, i.e., 21,000 symbols, and the QPSK demodulation circuit 2 performs the demodulation 21,000 times during one second and outputs the demodulation signals.

The demodulation signal is input to the first memory circuit 19 constituting the first frequency compensation circuit 3 as the address signal. The first memory circuit 19 outputs the frequency shift digital signal which is assigned by the address signal. The frequency shift digital signal is input to the integration circuit 20 and integrated with the reference frequency signal as a clock. Since the reference frequency signal is also input to the frequency measurement counter circuit 8, the integration carried out in the integration circuit 20 is synchronized with the frequency count performed in the frequency measurement counter circuit 8, and the integration circuit 20 integrates the frequency shift digital signals to be input thereto during one second, i.e., 21,000 frequency shift digital signals and outputs the integration signal. The integration signal is input to the division circuit 21. The value of the integration signal is divided by 21,000 and the frequency shift count signal is output. At this time, the output of the frequency shift count signal to the first subtraction circuit 4 is, however, interrupted because the power supply has been turned on.

The frequency count signal is input to the first subtraction circuit 4, but this signal is directly output as the compensation signal since the frequency shift count signal is not supplied thereto.

The compensation signal is input to the second subtraction circuit 22 constituting the first frequency compensation control circuit 5, and the truth value signal is subtracted from the compensation signal to detect the deviation from a desired frequency of the IF signal. Thereafter, the first frequency shift signal is output. The first frequency shift signal is input to the first comparison circuit 23, and the first control signal which is a high level signal is output if the first frequency shift signal belongs to the first frequency shift allowance signal. The first comparison circuit 23 is controlled in such a manner that the division circuit 21 outputs the frequency shift count signal to the first subtraction circuit 4 when the frequency measurement counter circuit 8 outputs the next frequency count signal. Meanwhile, If the first frequency shift signal does not belong to the first frequency shift allowance signal, a low level signal is output, and the setting which is the same as the power supply is turned on, i.e., the state in which the output to the division circuit 21 is interrupted is maintained when the frequency measurement counter circuit 8 output the next frequency counter signal. Here, it is assumed that the first frequency shift signal does not belong to the first frequency shift allowance signal; the first comparison circuit 23 outputs the low level signal; and the division circuit 21 is so controlled as not to output the frequency shift count signal to the first subtraction circuit 4 even when the frequency measurement counter circuit 8 outputs the next frequency count signal.

Since the output of the division circuit 21 is currently interrupted, the compensation signal, i.e. the frequency count signal is also input to the third subtraction circuit 26 constituting the convergence judgement circuit 7. The third subtraction circuit 26 Subtracts the truth value signal from the compensation signal to detect the deviation from a desired frequency of the IF signal and outputs the second frequency shift signal. The second frequency shift signal is input to the second comparison circuit 27, and the convergence completion signal which is the low level signal is output if the second frequency shift signal belongs to the second frequency shift allowance signal. Thereafter, the renewal of the retention signal retained in the retention circuit 9 is stopped.

Meanwhile, if the second frequency shift signal does not belong to the second frequency shift allowance signal, the high level signal is output, and the retention signal retained in the retention circuit 9 is renewed every time when the clock signal is supplied to the retention circuit 9, thereby compensating the deviation of the frequency of the reference frequency signal step by step. Here, it is assumed that the second frequency shift signal does not belong to the second frequency shift allowance signal; the second comparison circuit 27 outputs the high level signal; and the retention signal in the retention circuit 9 is renewed every time when the clock signal is fed to the retention circuit 9.

Further, since the compensation signal, i.e., the output of the division circuit 21 is currently interrupted, the frequency count signals also input to the fourth subtraction circuit 30 constituting the second frequency compensation circuit 6. The third subtraction circuit 30 subtracts the truth value signal from the compensation signal to detect the deviation from a desired frequency of the intermediate frequency signal, and outputs the third frequency signal. Assuming that the value of the frequency of the IF signal is lower than that of the desired frequency of the IF signal, the addition/ subtraction circuit 33 adds the retention signal in the retention circuit 9, which is currently the initial value initialized when the power supply is turned on, to the step width signal stored in the seventh memory circuit 33, and outputs the second control signal to the retention circuit 9. Since the switch circuit 11 is currently closed, the second control signal is fetched to the retention circuit 9 in synchronism with the input of the switch signal, and the retention circuit 9 outputs the second control signal to the DAC 12 as the retention signal.

The retention signal is converted into an analog signal by DAC 12 and output to the reference oscillation circuit 7 as the control voltage signal.

The above-described operation is thereafter repeated until the comparison in the first comparison circuit 23 constituting the first frequency compensation control circuit 5 is completed. That is, the operation is repeated until the first frequency shift signal belongs to the first frequency shift allowance signal and the first comparison circuit 23 outputs the first control signal which is the high level signal. If the first frequency shift signal belongs to the first frequency shift allowance signal and the first comparison circuit 23 outputs the first control signal which is the high level signal, it means that the QPSK demodulation circuit 2 can carry out the demodulation by using the IF signal. Then, the devision circuit 21 is controlled by the first control signal and outputs the frequency shift count signal to the first subtraction circuit 4. Therefore, after the frequency shift count signal is input to the first subtraction circuit 4, the compensation signal obtained by subtracting the amount of the frequency shift caused by the QPSK modulation from the frequency of the IF signal is input to the fourth subtraction circuit 30 composing the second frequency compensation circuit 6.

The detailed explanation will not be given as to the frequency shift count signal and the compensation signal which is obtained by subtracting the amount of the frequency shift caused by the QPSK modulation.

As for the frequency of the IF signal measured by the frequency measurement counter circuit 8 for one second, the value of the frequency shift obtained by the QPSK modulation corresponds to the value of the integration signal, and the frequency shift count signal divided by the value of this integration signal corresponds to a mean value of the values which are subjected to the frequency shift with one transmit signal, i.e., one symbol. Since the scrambling is performed on the transmit signal, the integration signal can not have a considerably large value. Namely, for example, even when the QPSK modulation is continuously performed ten times with the symbol 00, the frequency may not be shifted by $$2,625 \times 10 = 26.625 \text{ kHz}$$

and the maximum amount of the frequency shift may be a small value of approximately 2.625 kHz corresponding to $\frac{1}{8}\pi$ symbol.

Meanwhile, the measurement of the frequency of the IF signal for one second by the frequency measuring counter circuit 8 means that the frequency of the IF signal output for one second is integrated and the value obtained by counting the frequency corresponding to one symbol of the received signal, i.e., the frequency of the IF signal in the frequency measuring counter circuit 8 during $$1[S]/21[k \text{ symbol}] = 4.76 \times 10^{-5}[S/\text{symbol}]$$

is output as the frequency count signal. Accordingly, the compensation signal obtained by subtracting the frequency shift count signal from the frequency count signal means a signal obtained by subtracting the amount of the shift of the frequency of the IF signal which is produced with one symbol of the transmit signal from the frequency count signal. Therefore, a desired frequency of the IF signal can be obtained by subjecting the compensation signal which is obtained by subtracting the frequency shift count signal from the frequency count signal to a prior art AFC circuit. The subsequent operation will be explained hereinunder.

The compensation signal obtained by subtraction of the amount of the frequency shift due to the QPSK modulation is input to the second subtraction circuit 26 constituting the convergence judgement circuit 7 and the fourth subtraction circuit 3 composing the second frequency compensation circuit 6, respectively.

As described above, the convergence judgement circuit 7 outputs the high level signal until the second frequency shift signal belongs to the second frequency shift allowance signal and so controls as to input the switch signal to the retention circuit 9 via the switch circuit 11.

On the other hand, the second frequency compensation control circuit 6 also adds the step width signal to the compensation signal every time when the compensation signal is input thereto and repeatedly compensates the deviation of the frequency of the reference frequency signal caused by the temperature change, as described above.

The compensation signal obtained by subtraction of the amount of the frequency shift due to the QPSK modulation is compensated step by step by adding the step width signal thereto in the second frequency compensation circuit 9, and the frequency of the reference frequency signal is also compensated step by step. Consequently, the frequency of the IF signal is also converged on a desired frequency gradually.

The above-described compensation is repeated, and the second comparison circuit 27 constituting the convergence judgement circuit 7 outputs the convergence completion signal which is a low level signal when the second frequency shift signal belongs to the second frequency allowance signal. When this convergence completion signal is output, the switch circuit 11 is opened, and the input of the clock signal to the retention circuit is interrupted. At this time, the renewal of the retention signal retained in the retention circuit 9 is stopped, and the convergence is completed, namely, the desired frequency of the IF signal is output.

Thereafter, the frequency of the reference frequency signal is output in accordance with the retention signal retained in the retention circuit 9 at the time of the convergence completion, and the IF signal having the desired frequency is constantly output.

Obviously, numerous additional modifications and variations of the present invention are possible in light of the above teachings. It is, therefore, to be understood that within the scope of the appended claims, the invention may be practiced otherwise than as specifically described herein.

What is claimed is:

1. A frequency control circuit for a receiver of phase shift keying modulated signals comprising:

intermediate frequency (IF) signal generating means for generating an IF signal from a frequency of a radio signal and a local oscillation signal;

measuring means for measuring a frequency of said IF signal to output a first frequency measurement signal;

detecting means for detecting the frequency shift due to the phase shift keying modulation to output a frequency shift signal in response to a first control signal;

controlling means for detecting that the frequency of said IF signal is converged until said detecting means can detect the frequency shift due to the phase shift keying modulation, and outputting said first control signal;

arithmetic operation means for detecting a frequency of the IF signal which is not affected by the frequency shift due to the phase shift keying modulation from said frequency measurement signal and said frequency shift signal to output a second frequency measurement signal;

local oscillation signal generating means for outputting said local oscillation signal in accordance with a second control signal; and compensating means for receiving said first frequency measurement signal and said second frequency measurement signal and compensating said second control signal in order to converge the frequency of said IF signal on a desired frequency.

2. A frequency control circuit for a receiver of phase shift keying modulated signals claimed in claim 1, wherein said controlling means comprises:

first subtracting means for subtracting a desired frequency on which the frequency of said IF is to be converged from said first frequency measurement signal and outputting a first subtraction signal indicating the frequency deviation of the IF signal which is currently output; and comparing means for comparing said first subtraction signal with a frequency shift allowance signal indicating the frequency deviation of said IF signal due to the phase shift keying modulation, said frequency deviation of which can be detected by said detecting means.

3. A frequency control circuit for a receiver of phase shift keying modulated signals claimed in claim 2, wherein said detecting means comprises:

phase shift keying demodulation means for phase-shift-keying-demodulating said IF signal to output a demodulation signal;

a first memory circuit for using said demodulation signal as an address and outputting the frequency shift due to the phase shift keying modulation;

integrating means for integrating an output from said memory means; and dividing means for dividing an output from said integrating means by the number of output from said memory circuit to output said frequency shift signal when said first control signal is input thereto.

4. A frequency control circuit for a receiver of phase shift keying modulated signals claimed in claim 3, wherein said measuring means measures the frequency of said IF signal to output a first frequency measurement signal in synchronism with the integration of the output from said memory circuit by said integrating means.

5. A frequency control circuit for a receiver of phase shift keying modulated signals claimed in claim 2, wherein said arithmetic operation means is constituted by a second subtracting means.

6. A frequency control circuit for a receiver of phase shift keying modulated signals claimed in claim 2, wherein said local oscillation signal generating means comprises:

a reference oscillation circuit for outputting a reference frequency signal on the basis of said second control signal;

frequency dividing means for frequency-dividing said local oscillation signal to output a frequency division signal;

a phase comparison circuit for outputting a phase difference signal obtained from said frequency division signal and said reference frequency signal;

a low-pass filter for cutting high frequency components of said phase difference signal; and a voltage control oscillation circuit for outputting said local oscillation signal in accordance with an output signal from said low-pass filter.

7. A frequency control circuit for a receiver of phase shift keying modulated signals claimed in claim 2, wherein said compensating means comprises:

second subtracting means for subtracting a desired frequency on which the frequency of said IF signal is to be coverged from said first frequency measurement signal or said second frequency measurement signal to output a second subtraction signal indicating the deviation of the frequency of the IF signal;

adding/subtracting means for subtracting said second control signal from a predetermined step width when said second subtraction signal has a positive value, and adding said second control signal to said predetermined step width when said second subtraction signal has a negative value, and producing a compensated second control signal; and retaining means for retaining said compensated second control signal.

8. A frequency control circuit for a receiver of phase shift keying modulated signals claimed in claim 2, wherein said frequency control circuit further comprises convergence judging which judges whether the frequency of said IF signal is converged on a desired frequency by receiving said second frequency measurement signal and controls to stop the operation of said frequency control circuit for a receiver of phase shift keying modulated signals when the convergence is accomplished.

9. A frequency control circuit for a receiver of phase shift keying modulated signals claimed in claim 8, wherein said convergence judging means including:

third subtracting means for subtracting a desired frequency on which the frequency of said IF signal is converged from said second frequency measurement signal to output a third subtraction signal indicating the deviation of the frequency of said IF signal.

10. A receiver to receive $\pi/4$ shift quad phase shift keying modulated signals comprising:

IF signal generating means for generating an IF signal from the frequency of a received signal and a local oscillation frequency signal;

measuring means for measuring the frequency of said IF signal to output a first frequency measurement signal;

detecting means for detecting the frequency shift of the IF signal due to the $\pi/4$ shift quad phase shift keying modulation by $\pi/4$-shift-phase-shift-keying-demodulating said IF signal to output a frequency shift signal in response to a first control signal;

controlling means for subtracting a desired frequency of said IF signal, and producing calculating signal;

first comparing means for comparing said calculating signal with a frequency shift allowance signal corresponding to the $\pi/4$ shift symbol of the $\pi/4$ shift quad phase shift keying modulation, and outputting said first control signal;

arithmetic operation means for detecting the frequency of the IF signal which is not affected by the frequency shift due to the $\pi/4$ shift quad phase shift keying modulation from said frequency measurement signal and said frequency shift signal to output a second frequency measurement signal;

local oscillation signal generating means for outputting said local oscillation frequency signal in accordance with a second control signal;

compensating means for receiving said first frequency measurement signal and said second frequency measurement signal and compensating said second control signal in order to converge the frequency of said IF signal on a desired frequency; and convergence judging means for judging whether the frequency of said IF signal is converged on a desired frequency, and controlling so as to stop the operation of said compensating means when the convergence is accomplished.

11. A receiver to receive $\pi/4$ shift quad phase shift keying modulated signals claimed in claim 10, wherein said measuring means measures the frequency of said IF signal to output said first frequency measurement signal in synchronism with the detection of the frequency shift of said IF signal due to said $\pi/4$ shift quad phase shift keying modulation by said detecting means.

12. A receiver to receive $\pi/4$ shift quad phase shift keying modulated signals claimed in claim 10, wherein said arithmetic operation means is constituted by a first subtracting means.

13. A receiver to receive $\pi/4$ shift quad phase shift keying modulated signals claimed in claim 10, wherein said oscillation signal generating means comprises:

a reference oscillation circuit for outputting a reference frequency signal in accordance with said second control signal;

a frequency division circuit for frequency-dividing said local oscillation signal to output a frequency division signal;

a phase comparison circuit for outputting a phase difference signal obtained from said frequency division signal and said reference frequency signal;

a low-pass filter for cutting high frequency components of said phase difference signal; and a voltage control oscillation circuit for outputting said local oscillation signal in accordance with an output signal from said low-pass filter.

14. A receiver to receive $\pi/4$ shift quad phase shift keying modulated signals claimed in claim 10, wherein said compensating means comprises:

second subtracting means for subtracting a desired frequency on which the frequency of said IF signal is to be converged from said first frequency measurement signal or said second frequency measurement signal to output a first subtraction signal representing the deviation of the frequency of the IF signal;

adding/subtracting means for subtracting said second control signal from a predetermined step width when said first subtracting signal has a positive value, and adding said second control signal to said predetermined step width when said first subtraction signal has a negative value and producing a compensated second control signal; and retaining means for retaining said compensated signal control signal.

15. A receiver to receive $\pi/4$ shift quad phase shift keying modulated signals claimed in claim 10, wherein said convergence judging means comprises:

third subtracting means for subtracting a desired frequency on which the frequency of said IF signal is to be converged from said second frequency measurement signal to output a second subtraction signal representing the deviation of the frequency of the IF signal; and second comparing means for judging whether the deviation of the frequency of said IF signal from a desired frequency is within a predetermined allowable range and controlling so as to stop the operation of said receiver to receive $\pi/4$ shift quad keying modulated signal when the deviation of the frequency of said IF signal is within said predetermined allowable range.

\* \* \* \* \*